United States Patent [19]

Inagawa et al.

[11] Patent Number: 5,126,532
[45] Date of Patent: Jun. 30, 1992

[54] APPARATUS AND METHOD OF BORING USING LASER

[75] Inventors: Hideho Inagawa, Yokohama; Shigenobu Nojo, Kawasaki, both of Japan

[73] Assignee: Canon Kabushiki Kaisha, Tokyo, Japan

[21] Appl. No.: 459,473

[22] Filed: Jan. 2, 1990

[30] Foreign Application Priority Data

- Jan. 10, 1989 [JP] Japan .......................... 1-3462
- Oct. 27, 1989 [JP] Japan .......................... 1-278354
- Oct. 27, 1989 [JP] Japan .......................... 1-278355
- Oct. 27, 1989 [JP] Japan .......................... 1-278356

[51] Int. Cl.$^5$ .............................................. B23K 26/00
[52] U.S. Cl. ............................. 219/121.7; 219/121.76; 219/121.74; 219/121.75
[58] Field of Search ............ 219/121.7, 121.71, 121.76, 219/121.74, 121.75, 121.79, 121.68, 121.69

[56] References Cited

U.S. PATENT DOCUMENTS

| | | | |
|---|---|---|---|
| 4,789,770 | 12/1988 | Kasner et al. | 219/121.7 |
| 4,820,899 | 4/1989 | Hikima et al. | 219/121.74 X |
| 4,839,497 | 6/1989 | Sankar et al. | 219/121.76 X |

FOREIGN PATENT DOCUMENTS

| | | |
|---|---|---|
| 20390 | 2/1983 | Japan . |
| 168489 | 10/1983 | Japan . |
| 254117 | 11/1987 | Japan . |
| 289390 | 12/1987 | Japan . |

*Primary Examiner*—C. L. Albritton
*Attorney, Agent, or Firm*—Fitzpatrick, Cella, Harper & Scinto

[57] ABSTRACT

A two-step boring process is disclosed. A first step of the process is high speed rough boring by thermal processing using a long wavelength laser, and a second step is an optical chemical processing using a short wavelength laser for smoothing the bore wall. A highly reliable through hole can be high speed processed in a short period of time. The bore thus formed has excellent bore wall shape while it has a very small diameter.

10 Claims, 10 Drawing Sheets

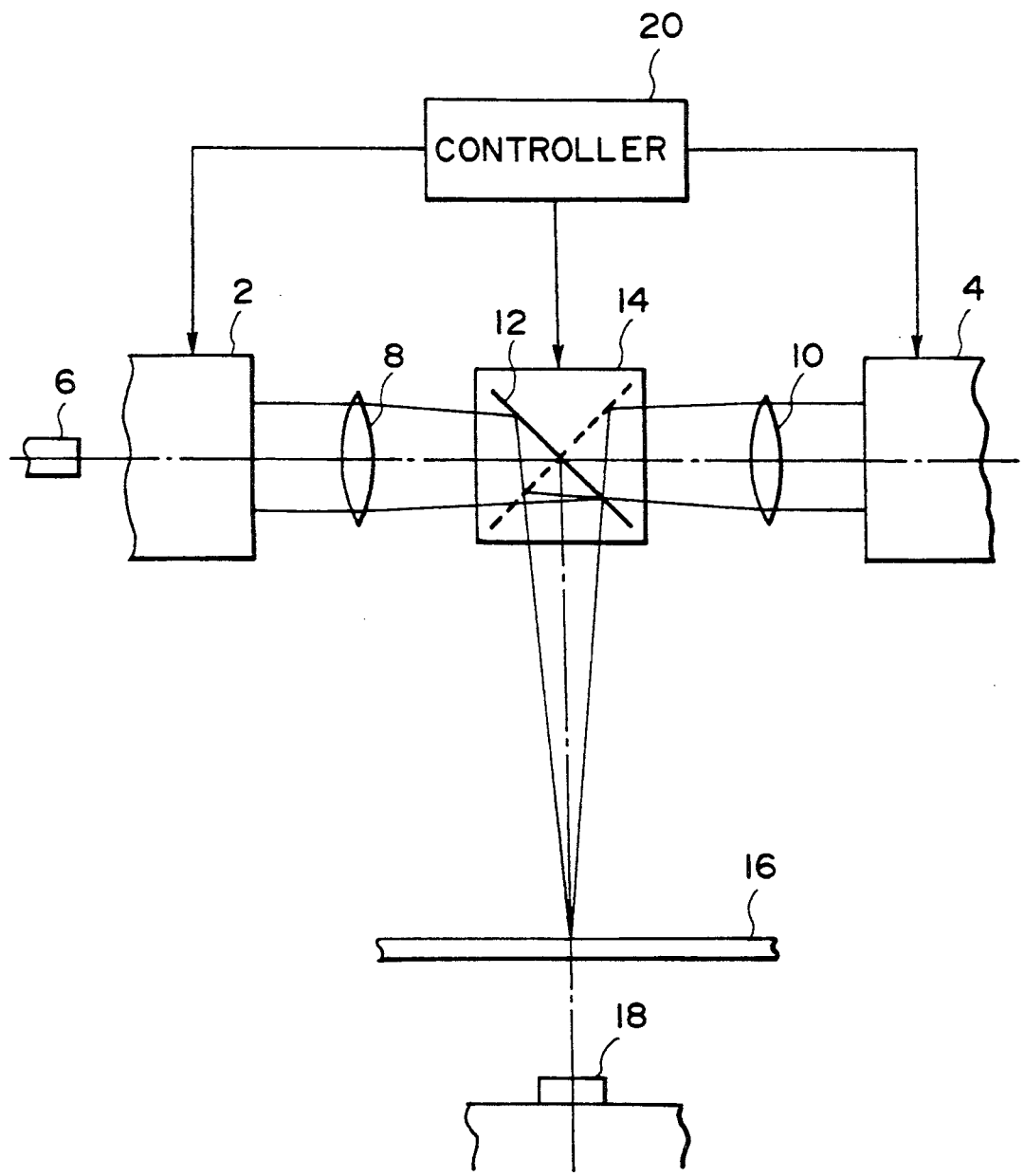
F I G. 3

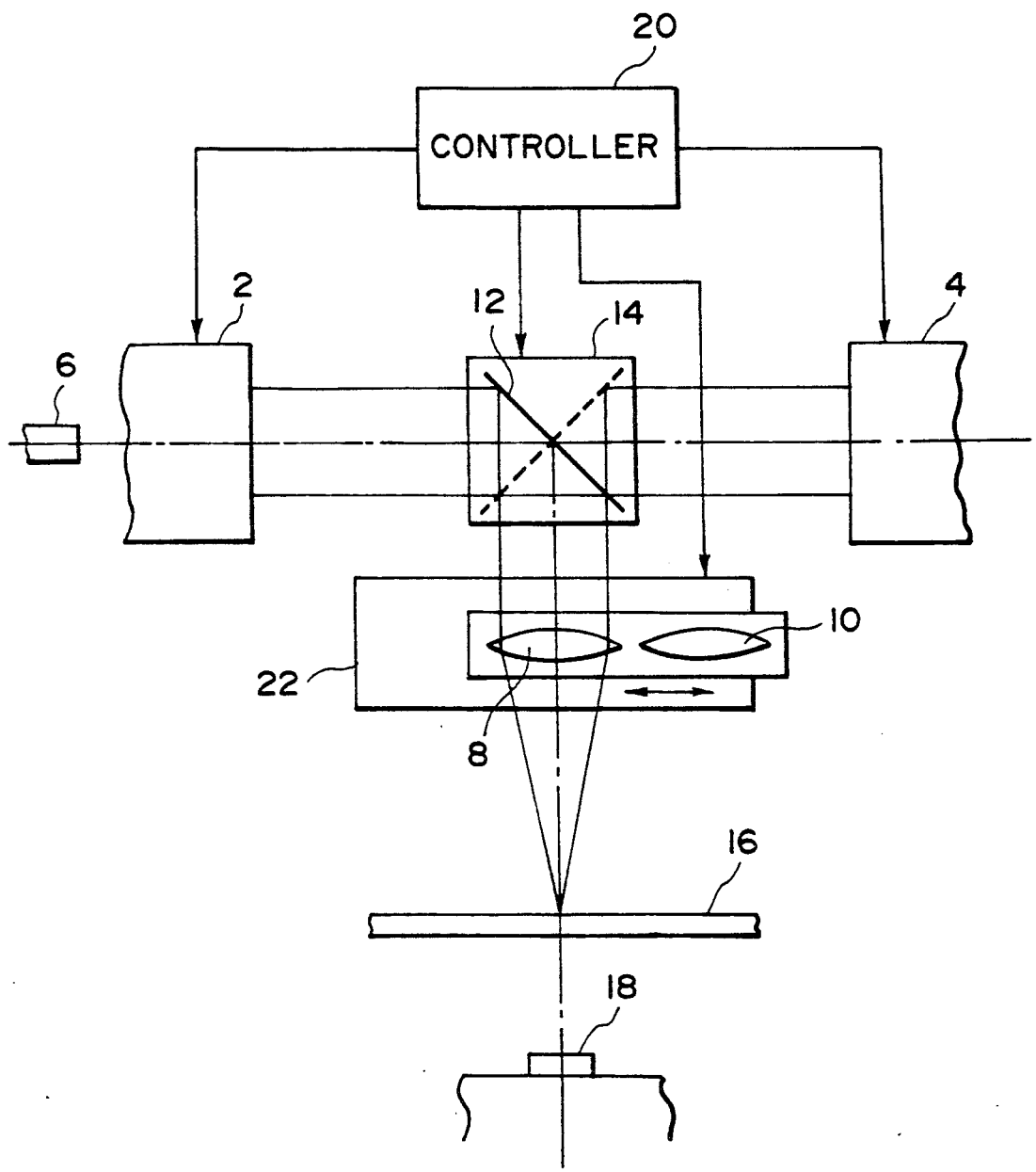
F I G. 6

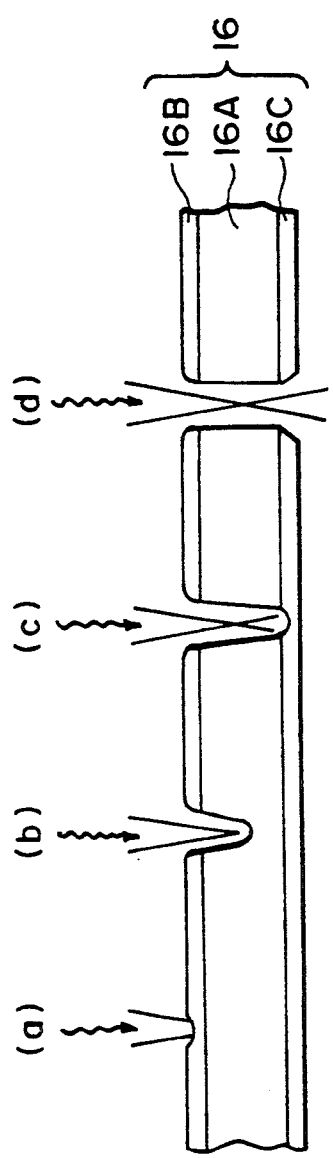
F I G. 8
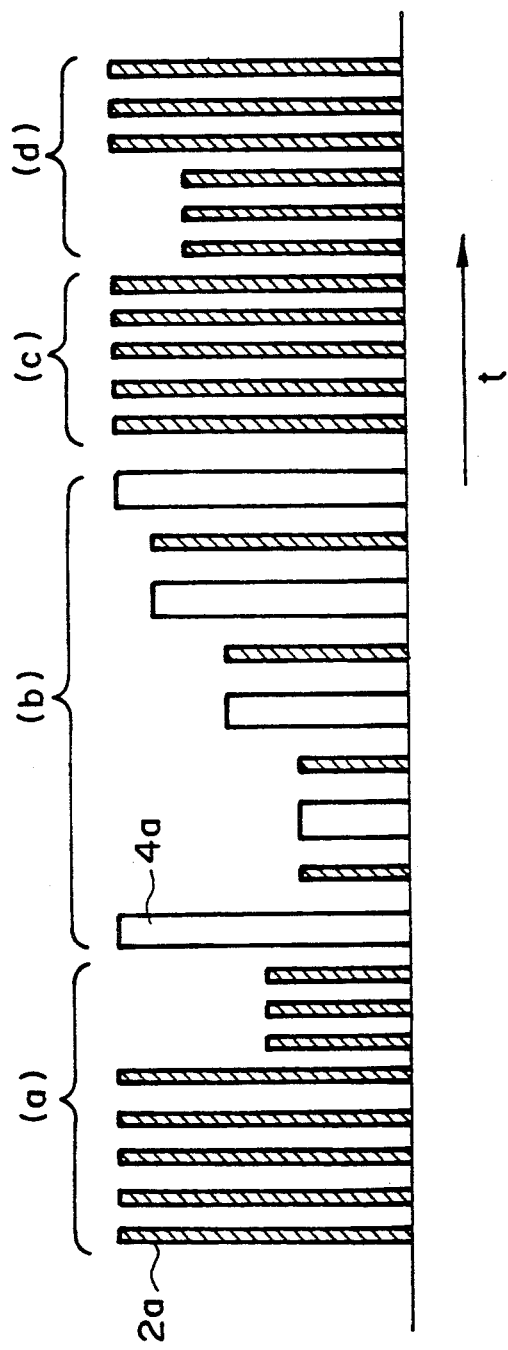
F I G. 9 t

APPARATUS AND METHOD OF BORING USING LASER

BACKGROUND OF THE INVENTION

1. Field of the Invention

This invention relates to a method of processing a substrate of a printed circuit board or the like using a laser beam.

2. Related Background Art

Heretofore, through holes of printed circuit boards were formed by a mechanical boring process using a drill, and for forming small-diameter holes expensive super-hard drills having high mechanical strength have been used. Conductive material is precipitated in the holes formed with the drill.

FIGS. 1(a) and 1(b) illustrate an example such prior art methods of processing. Shown in FIG. 1(a) is a sectionnal view of a double-side glass epoxy substrate with a hole formed using drill 6, showing random irregularities of the hole wall surface and deviation of the upper and lower open end positions from each other (due to shooting of the drill). Shown in FIG. 1(b) is a conductor formed on the hole wall.

Since in this example the hole is formed mechanically using a drill, the following problems are encountered when the hole diameter is reduced.

1) The drill diameter is reduced, and therefore the mechanical strength of the drill edge and life of drill are reduced.

2) To obtain as long drill life as possible, the feed speed has to be reduced. Therefore, the processing time is increased.

3) The straightness and positional accuracy of the hole are inferior.

4) The irregularities of the hole wall are large with respect to the hole diameter, and therefore, it is difficult to form conductive material uniformly on the hole wall. Reliability with respect to various stresses is thus inferior.

There have been proposed method of forming holes having very small diameters using laser beams (as disclosed in, for instance, Japanese Laid-Open Patents 58-20390, 58-168489, 62-254117 and 62-289390).

Japanese Laid-Open Patent 62-254117 discloses a medical treatment apparatus for cutting a body portion by irradiation with a laser beam, particularly with two different laser beams from independent lasers (i.e., $CO_2$ laser and YAG laser).

Japanese Laid-Open Patent 62-289390 a laser processing machine for irradiating the same place for processing with two laser beams having different wavelength. Particularly, a oscillation efficiency and high output long wavelength laser is used as main beam, and a high absorptivity short wavelength laser is used to provide a pre-pulse laser beam output. In this laser processing machine, optical means for making the optical axes of these two beams to be indentical is provided for irradiating the same place with the two beams. As the high output long wavelength laser are used $CO_2$ lasers, $CO_2$ lasers, YAG lasers, etc., and as the short wavelength laser are used excimer lasers, solid lasers of rubby or alexandlite, metal vapor lasers and like high recurring rate pulse lasers.

SUMMARY OF THE INVENTION

A first object of the invention is to provide a method and an apparatus of forming holes using laser, which utilizes a laser beam for utilizing thermal and optical energy for processing to cope with hole diameter reduction.

Long wavelength lasers such as $CO_2$ lasers, YAG lasers provide low photon energy of laser beam and are mainly used for thermal processes. Particularly, where resin substrates are dealt with, generation of black carbide occurs and there is a difference in the etching rate between resin and glass. Short wavelength lasers such as excimer lasers, on the other hand, provide high photon energy of a laser beam and are mainly used for processes based on opto-chemical reactions. Therefore, generation of black carbide is suppressed and resin and glass can be etched more uniformly. However, the average output is low, and long time is taken for the process.

To attain the above first object of the invention, there is provided an apparatus, which can perform a two-step process consisting of a first step of high speed forming a hole by thermal processing using a long wavelength laser and a second step of smoothing the hole wall by opto-chemical processing using a short wavelength laser, thus obtaining a highly reliable through hole having a small diameter and excellent hole wall shape in a short period of time.

Where IC chips, resistors, capacitors and other circuit elements are soldered to a circuit pattern as in a printed circuit board or through holes in a substrate are plated to provide electric conduction, a copper foil circuit pattern and a resin part thereunder are formed with through holes using a laser beam.

A second object of the invention is to provide an apparatus, which provides a pulse laser beam output of a short wavelength laser such as an excimer laser for a copper foil circuit pattern part, provides a pulse laser beam output of a long wavelength laser such as a $CO_2$ laser for a resin part, and further provides alternate pulse laser beam outputs of short and long wavelength lasers for removal of carbide generated in the processing of the resin part, thus permitting finishing of the hole wall surface to a smooth surface with less irregularities.

A third object of the invention is to provide, in an apparatus for irradiating the same portion (or point) of a processing surface of a work with a plurality of different wavelength laser beams, an optical suitable for causing a plurality of laser beams from independent laser means to be projected onto the same surface portion noted above.

A further object of the invention is to provide an apparatus, which can simultaneously irradiate both the front and back sides of a copper foil part with pulse laser beams for forming accurate through holes in a short period of time as possible to obtain a printed circuit board having copper foil circuit patterns on both the front and back sides of substrate.

BRIEF DESCRIPTION OF THE DRAWINGS

FIGS. 3 to 6 illustrate a second embodiment of the invention, in which:

FIG. 3 is a schematic view showing an apparatus according to the invention;

FIG. 4 is a sectional view showing an eventual printed circuit board subjected to formation of holes using the apparatus according to the invention;

FIG. 5 is a view showing an example of laser beam pulse timings with the apparatus according to the invention; and FIG. 6 is a schematic view showing the apparatus according to the invention;

FIGS. 7 to 10 illustrate a second embodiment of the invention, in which:

FIG. 7 is a schematic view showing an apparatus according to the invention;

FIG. 8 is a sectional view showing an eventual printed circuit board subjected to formation of holes using the apparatus according to the invention;

FIG. 9 is a view showing an example of laser beam pulse timings with the apparatus according to the invention; and FIG. 10 is a schematic view showing the apparatus according to the invention; and FIGS. 11 to 13 illustrate a fourth embodiment of the invention, in which:

FIG. 11 is a schematic view showing an apparatus according to the invention;

FIG. 12 is a sectional view showing a printed circuit board subjected to hole formation; and FIG. 13 is a view showing laser beam pulse timings with apparatus according to the invention.

DETAILED DESCRIPTION OF THE PREFERRED EMBODIMENTS

FIGS. 2(a) to 2(d) illustrate a first embodiment of the invention.

Figure 2A:
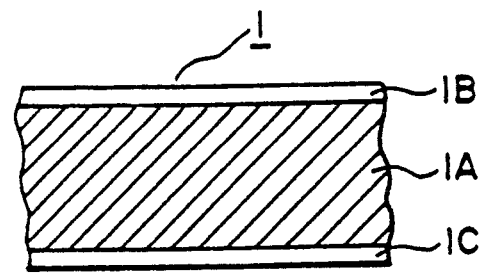
FIGS. 2(a) to 2(d) illustrate a first embodiment of the invention, showing, in FIG. 2(a) is an initial state, in FIG. 2(b) is a long wavelength beam, in FIG. 2(c) is a short wavelength beam, and in FIG. 2(d) is a state after formation of conductor.

FIG. 2(a) is a sectional view showing substrate 1 of a printed circuit board.

Substrate 1 used in this embodiment consists of glass epoxy substrate 1A and copper parts 1B and 1C provided on circuit patterns provided on the front and back sides of substrate 1A. The thickness of the substrate 1 is 600 microns, and the thickness of the copper layer is 18 microns.

Figure 2B:
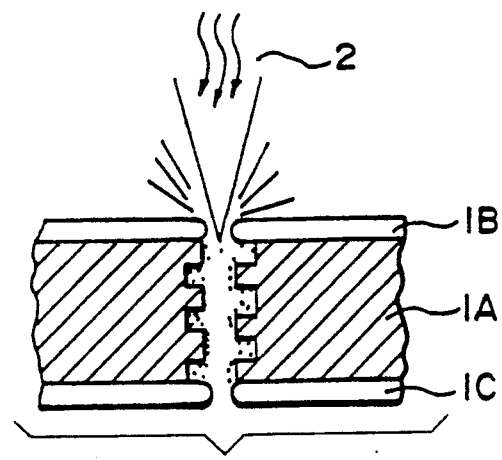
Figure 2C:
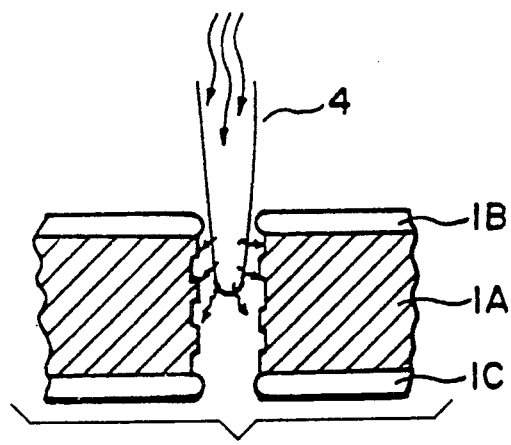
Figure 2D:
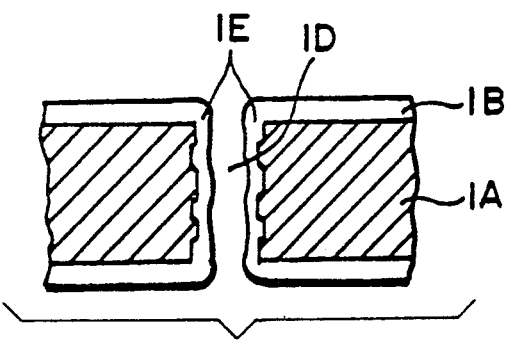

FIG. 2(d) shows a sectional shape of a through hole as object of processing according to the invention. The wall surface of through hole 1D is provided with copper plating 1E for obtaining conduction between the front and back sides. The desired diameter 1D of through hole $D_1$ shown in FIG. 2(d) is set to 0.1 mm. The thickness of copper plating 1E is set to 10 microns. In a first step of processing, long wavelength laser beam 2 is projected from long wavelength laser beam generator (not shown) onto substrate 1 at a desired position thereof.

As long wavelength laser is used a $CO_2$ laser with a wavelength of 10.6 microns. In the first step, a first through hole is formed as shown in FIG. 2(b). As shown schematically in the sectional view of FIG. 2(b), the through hole has an irregular wall surface consisting of raised portions presumably constituted by residue of glass part and depressed portions formed by removal of epoxy. Further, carbide particles are attached to the surface as shown by dots.

In a second step, as shown in FIG. 2(c) the surface of first through hole formed in the first step is irradiated with short wavelength laser beam 4 from short wavelength laser beam generator means (not shown). As short wavelength laser was used a KrF excimer laser with a wavelength of 0.248 micron.

In the second step, it is possible to obtain vanishment of carbide generated during processing with the long wavelength laser beam in the first step and smoothing of the irregular wall surface of the hole with opto-chemical reaction of the excimer laser.

In this embodiment, if the desired diameter $D_1$ of the through hole is set to 0.1 mm (i.e., 100 microns) and the thickness of plating to 10 to 20 microns, the beam diameter of the short wavelength laser beam in the second step is reduced such that the desired hole diameter obtained in the processing of the second step is 70 to 80 microns.

Further, the beam diameter of the long wavelength laser beam in the first step is reduced such that the desired diameter of the hole formed in the processing of the first step is 60 to 70 microns, i.e., about 90% of the desired hole diameter in the second step. Conduction, thermal impact reliability based on dipping in oil and deviation of upper and lower open end positions were evaluated to obtain results as in the Table below.

| evaluation item | content of test | embodiment 1 | embodiment 2 | example for comparison |
|---|---|---|---|---|
| conductivity | less than 50 mΩ/hole good | good/total = 99/100 | 95/100 | 50/100 |
| heat shock | repeat 10 times dipping in oil 260° C., 5 sec. | good/total = 50/50 | 48/50 | 5/50 |
| positioning accuracy | position deviation of center axis | ±10 μm | ±10 μm | ±50 μm |

Sample through hole diameter is about 0.1 mm.

As shown above, by using high energy beams, i.e., a long wavelength beam for thermal processing in a first step and a short wavelength beam for opto-chemical processing in a second step, it is possible to obtain a through hole, which has very small diameter, high positional accuracy and excellent surface wall shape, with high reliability.

Now, a second embodiment of the invention will be described with reference to drawings.

FIG. 3 is a schematic view showing an apparatus as second embodiment of the invention.

Referring to FIG. 3, reference numeral 2 designates first laser, and 4 second laser. The first laser is a short wavelength excimer laser (KrF: wavelength λ=248 nm), which performs pulse oscillation. The second laser is a long wavelength $CO_2$ laser (wavelength:=10.6 microns). It is possible to use a YAG laser (wavelength λ=1.06 microns) in lieu of the $CO_2$ laser.

Reference numeral 6 designates a reference light source. Here, a He-Ne laser is used.

Reference numeral 8 designates lens for converging the laser beam emitted from laser 2. The lens is a quartz lens. Reference numeral 10 designates lens for converging the laser beam emitted from laser 4. This lens consists of ZnSe. It is possible to use GaAs in lieu of ZnSe.

Figure 1A:
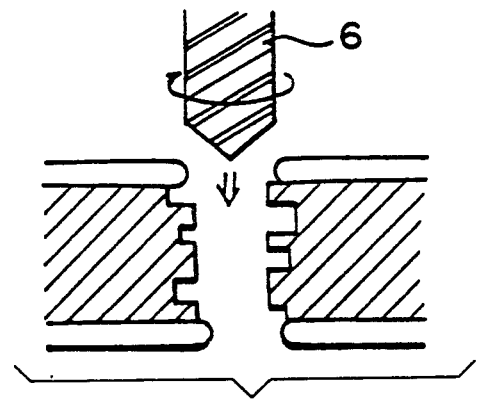
FIG. 1(a) is a sectional view illustrating mechanical processing using a drill as a prior art example and FIG. 1(b) is a sectional view after formation of conductor.
Figure 1B:
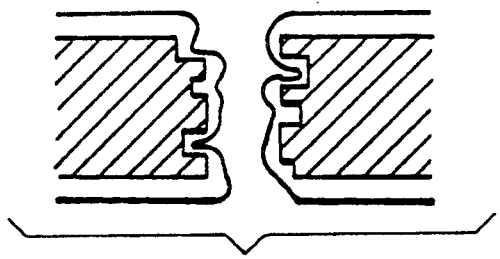

The above three lasers 2, 4 and 6 and two converging lenses 8 and 10 have an identical optical axis. On this optical axis mirror 12 is disposed between converging lenses 8 and 10. The mirror can be turned about an axis perpendicular to the plane of paper of FIG. 1 by reversible driver 14 to a first position shown by solid line and a second position shown by dashed line.

Reference numeral 16 designates eventual printed circuit board as work. The board may be a glass epoxy copper lining lamination plate (available as "TLC-W-551" provided by Toshiba Chemical Co., Ltd. with a thickness of 0.6 mm). The board is supported for displacement on an X-Y displacement table (not shown).

Reference numeral 18 designates a reference laser beam sensor.

When mirror 12 is at the first position, the laser beam from laser 2 is converged by converging lens 8 and then reflected by mirror 12 to form a beam spot (with a diameter of 100 microns, for instance) on board 16 at a predetermined processing position thereof.

Reference numeral 20 designates a controller for controlling the oscillation of lasers 2 and 4 and operation of reversible driver 14.

In this embodiment of the apparatus, when controller 20 provides an irradiation command to laser 2, it provides a command signal to reversible driver 14 to bring mirror 12 to the first position. When controller 20 provides an irradiation command to laser 4, it provides a command signal to reversible driver 14 to bring mirror 12 to the second position. As is shown, with this embodiment the pulse oscillation of the first laser and that of the second laser are synchronized to the reversible rotary operation of the mirror. As is shown above, with this embodiment an optical path from mirror 12 to printed circuit board 16 is common to two laser beams. With printed circuit board 16 disposed on and perpendicular to this optical path, very satisfactory vertical hole formation can be obtained.

In this embodiment, adjustment of the positions of the lasers and optical system can be done by detecting the laser beam from reference beam laser 6 with sensor 18 without mounting printed circuit board 16.

Figure 4:
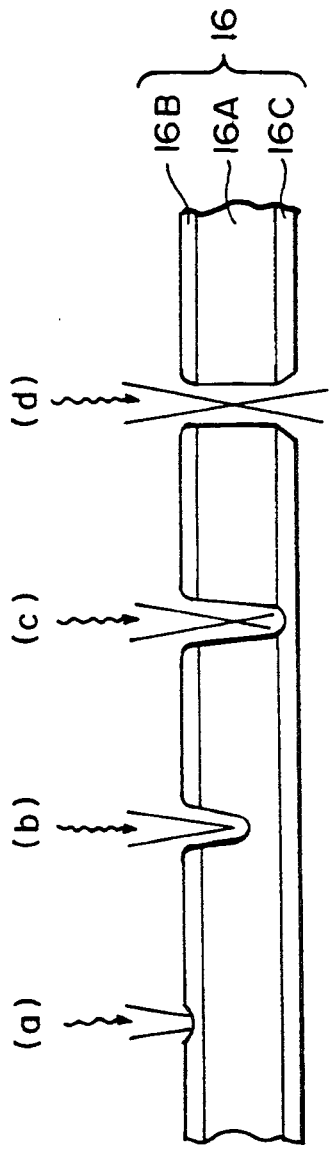

FIG. 4 is a sectional view showing printed circuit board 16 being processed for hole formation with the embodiment of the apparatus. As the processing proceeds, the status is changed from (a) to (d). Printed circuit board 16A consists of glass epoxy insulating layer (hereinafter referred to merely as "resin part") 16 and copper foils 16B and 16C provided on the opposite sides of layer 16A.

Figure 5:
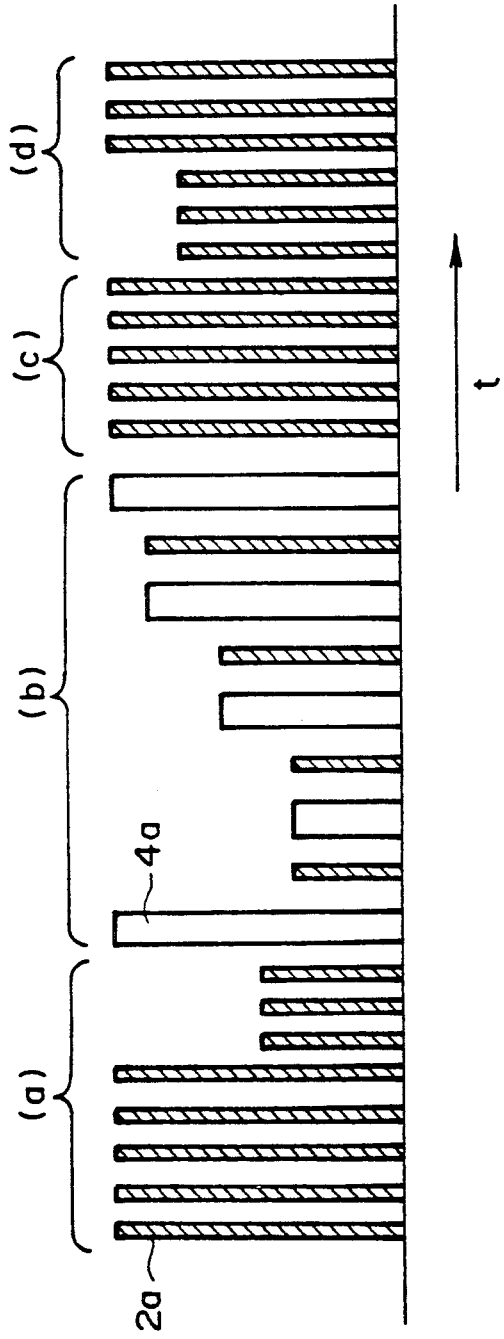

FIG. 5 is a view showing an example of pulse timings of lasers 2 and 4 in this embodiment.

During processing of copper foil part 16B as shown in FIG. 4(a), sole excimer laser beam 2a is utilized as shown in FIG. 5(a). The excimer laser beam has a short wavelength, and thus it has high energy and is suited for the processing of the copper foil part.

During processing of resin part 16A as shown in FIG. 4(b), sole $CO_2$ laser beam 4a is utilized as shown in FIG. 5(b). The $CO_2$ laser beam has a long wavelength, and thus it provides low photon energy and is mainly used for thermal processing. It is thus suited for the processing of resin part 16A. In the processing using this long wavelength beam, carbide is generated. In addition, irregularities of the hole wall surface are liable to be increased due to different etching rates of glass and epoxy. Accordingly, for the processing of the resin part excimer laser beam 2a is employed in combination as shown in FIG. 5(b). Thus, the carbide can be removed, the difference of the etching rate can be reduced, and a hole with less irregularities of its surface can be obtained.

During processing of copper foil part as shown in FIG. 4(c), sole excimer laser beam 2a is employed as shown in FIG. 5(c).

After the through hole is formed as shown in FIG. 4(d), last irradiation with excimer laser beam 2a is effected as a finish step of removing residual material from the hole wall surface.

As shown in FIG. 5, with this embodiment the two laser beams are not simultaneously pulse outputted, but the position mirror 12 is controlled such that laser beam is led to the processing position of printed circuit board 16 during pulse generation of the beam.

FIG. 6 is a schematic view showing a modification of the second embodiment of the invention. In the Figure, parts like those shown in FIG. 3 are designated by like reference numerals.

In this modification, two converging lenses 8 and 10 are disposed between mirror 12 and printed circuit board 16. These lenses are supported by driver 22 such that they can be reciprocally displaced in directions perpendicular to the optical axis. Thus, a desired one of the two lenses can be positioned on the optical axis. The operation of driver 22 is controlled by controller 20.

In this embodiment, lens 8 is brought to be on the optical axis simultaneously with the operation of bringing mirror 12 to the first position under control of controller 20. Also, control is provided to bring lens 10 to be on the optical axis simultaneously with the operation of bringing mirror 12 to the second position.

With this modification, the same effects as those with the second embodiment can be obtained.

As has been shown in this embodiment two optical paths leading from two lasers to a processing position on printed circuit board have a common portion, and laser beams irradiating the printed circuit board are switched by a reversible mirror. Thus, the two different laser beam can be projected perpendicularly onto the printed circuit board to obtain satisfactory hole formation.

In addition, both the high speed processing utilizing the high output of the long wavelength laser and the clear processing utilizing the high photon energy of the short wavelength laser can be performed, and desired laser can be used for the processing of the resin part and processing of the copper foil part. It is thus possible to obtain satisfactory accuracy of processing and high processing speed.

Further by providing the two laser beams as pulse laser beams they can be used alternatively in a very quick cycle. Thus, both the laser beams can be used in combination in effect, if necessary, to obtain satisfactory processing.

Now, a third embodiment of the invention will be described with reference to the drawings.

Figure 7:
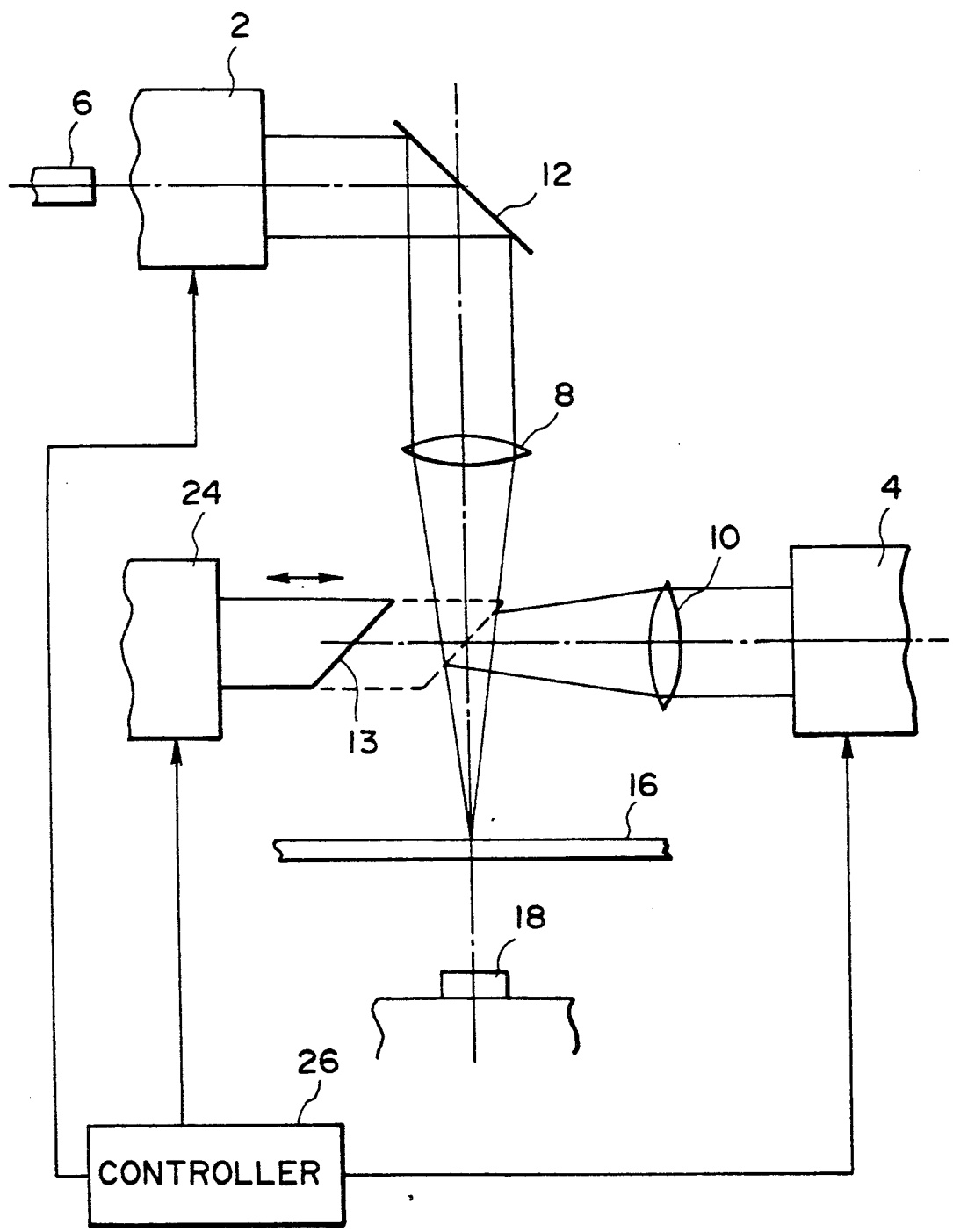

FIG. 7 is a schematic view showing an apparatus as third embodiment of the invention.

Referring to FIG. 7, reference numeral 2 designates first laser, and 4 second laser. The first laser is a short wavelength excimer laser (KrF: wavelength $\lambda = 248$ nm), which performs pulse oscillation. The second laser is long wavelength $CO_2$ laser (wavelength: $\lambda = 10.6$ microns). It is possible to use a YAG laser (wavelength $\lambda = 1.06$ microns) in lieu of the $CO_2$ laser.

Reference numeral 6 designates a reference light source. Here, a He-Ne laser is used.

Reference numeral 12 designates mirror for deflecting a laser beam emitted from laser 2.

Reference numeral 28 designates lens for converging &he laser beam emitted from laser 2. The lens is a quartz lens. Reference numeral 10 designates lens for converging the laser beam emitted from laser 4. This lens consists of ZnSe. It is possible to use GaAs in lieu of ZnSe.

Lasers 2 and 6 have an identical optical axis.

Reference numeral 16 designates the eventual printed circuit board as the work piece. The board may a glass epoxy copper lining lamination plate (available as "TLC-W-551" provided by Toshiba Chemical Co., Ltd. with a thickness of 0.6 mm). The board is supported for displacement on an X-Y displacement table (not shown).

Reference numeral 18 designates a reference laser beam sensor.

The laser beam from laser 2 is reflected by mirror 12 and then converged by converging lens 8 to from a spot (with a diameter of 100 microns, for instance) on printed circuit board 16 at a predetermined position thereof.

Mirror 13 is disposed near the optical path leading from converging lens 8 to printed circuit board 16. The mirror is reciprocally displaced in the directions of arrows by driver 14 to a first position shown by solid line and a second position shown by dashed line.

When mirror 13 is at the second position, the laser beam from laser 4 is converged by converging lens 10 and then reflected by mirror 13 to form a beam spot (with a diameter of 100 microns, for instance) on board 16 at a predetermined processing position thereof.

Reference numeral 26 designates controller for controlling the oscillation of lasers 2 and 4 and operation of reversible driver 14.

In this embodiment of the apparatus, when controller 26 provides an irradiation command to laser 2, it provides a command signal to reversible driver 24 to bring mirror 12 to the first position. When controller 26 provides an irradiation command to laser 4, it provides a command signal to reversible driver 24 to bring mirror 12 to the second position. As is shown, with this embodiment the pulse oscillation of two lasers 2 and 4 and reversible rotary operation of mirror 13 are synchronized to one another.

As is shown, with this embodiment an optical path from mirror 13 in the second position to printed circuit board 16 is common to two laser beams. With printed circuit board 16 disposed on and perpendicular to this optical path, very satisfactory vertical hole formation can be obtained.

In this embodiment, adjustment of the positions of the lasers and optical system can be done by detecting the laser beam from reference beam laser 6 with sensor 18 without mounting printed circuit board board 16.

FIG. 8 is a sectional view showing printed circuit board 16 being processed for hole formation with the embodiment of the apparatus. As the processing proceeds, the status is changed from (a) to (d). Printed circuit board 16A consists of glass epoxy insulating layer (hereinafter referred to merely as "resin part") 16 and copper foils 16B and 16C provided on the opposite sides of layer 16A.

FIG. 9 is a view showing an example of pulse timings of lasers 2 and 4 in this embodiment.

During processing of copper foil part 16B as shown in FIG. 8(a), sole excimer laser beam 2a is utilized as shown in FIG. 9(a). The excimer laser beam has a short wavelength, and thus it has high energy and is suited for the processing of the copper foil part.

During processing of resin part 16A as shown in FIG. 8(b), sole $CO_2$ laser beam 4a is utilized as shown in FIG. 5(b). The $CO_2$ laser beam has a long wavelength, and thus it provides low photon energy and is mainly used for thermal processing. It is thus suited for the processing of resin part 16A. In the processing using this long wavelength beam, however, carbide is generated. In addition, irregularities of the hole wall surface are liable to be increased due to difference etching rates of glass and epoxy.

Accordingly, for the processing of the resin part excimer laser beam 2a is employed in combination as shown in FIG. 9(c). Thus, the carbide can be removed, the difference of the etching rate can be reduced, and a hole with less irregularities of its surface can be obtained.

During processing of copper foil part as shown in FIG. 8(c), sole excimer laser beam 2a is employed as shown in FIG. 9(c).

After the through hole is formed as shown in FIG. 8(d), last irradiation with excimer laser beam 2a is effected as a finish step of removing residual material from the hole wall surface as shown in FIG. 9(d).

As shown in FIG. 9, with this embodiment the two laser beams are not simultaneously pulse outputted, but the position of mirror 13 is controlled such that each laser beam is led to the processing position of printed ciurcuit board 16 during pulse generation of the beam.

Figure 10:
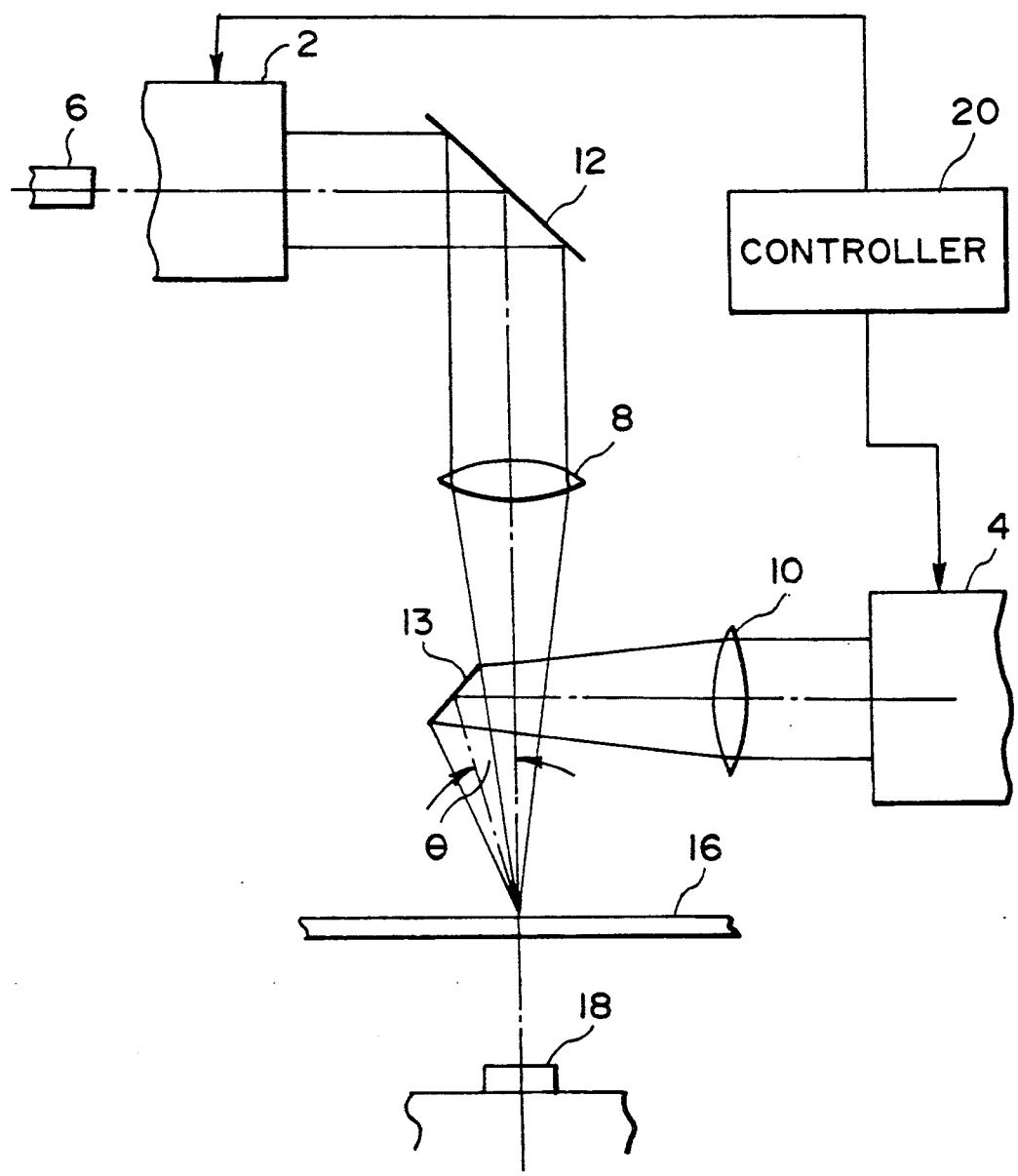

FIG. 10 is a schematic view showing a modification of the third embodiment of the invention. In the Figure, parts like those shown in FIG. 3 are designated by the same reference numerals.

In this embodiment, a stationary mirror 13 is provided such that it does not block the optical path leading from converging lens 8 to printed circuit board 16. Thus, the laser beam from laser 4 is converged by converging lens 10 and then reflected by mirror 13 to form a beam spot (with a diameter of 100 microns) on printed circuit board 16 at a predetermined processing position. The optical path leading from mirror 13 to printed circuit board 16 and that leading from converging lens 8 to printed circuit board 16 make an angle $\theta$. This angle is set to be in a range, in which desired accuracy of the hole formation can be attained (for instance 15° or below).

In this embodiment, two laser beams can be simultaneously projected onto printed circuit board 16.

Again in this embodiment, effects like those in the above third embodiment can be obtained.

As has been shown, laser beams emitted from two lasers are projected onto printed circuit board at a processing position thereof in the same direction or substantially in the same direction. The two laser beams thus can be projected perpendicularly or substantially perpendicularly onto the printed circuit board, and satisfactory hole formation can be obtained.

In addition, both the high speed processing utilizing the high output of the long wavelength laser and the clear processing utilizing the high photon energy of the short wavelength laser can be performed, and desired lasers can be used for the processing of the resin part and processing of the copper foil part. It is thus possible to obtain satisfactory accuracy of processing and high processing speed.

Further, by providing the two laser beams as pulse laser beams they can be used alternatively in a very quick cycle. Thus, both the laser beams can be used in combination in effect, if necessary, to obtain satisfactory processing.

Now, the fourth embodiment of the invention will be described.

Figure 11:
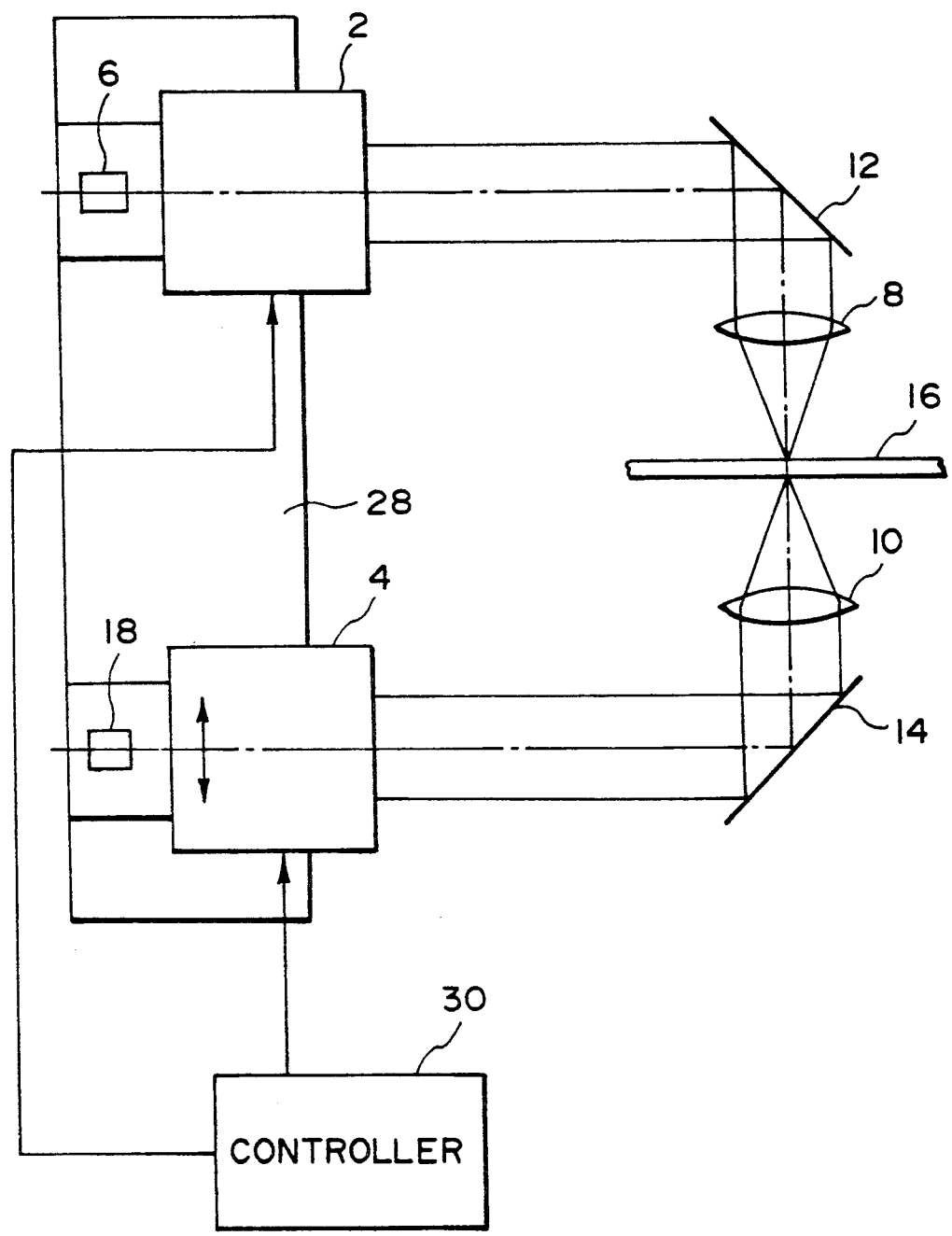

FIG. 11 is a schematic view showing an apparatus as fourth embodiment of the invention.

Referring to FIG. 11, reference numeral 2 designates first laser, and 4 second laser. The first laser is a short wavelength excimer laser (KrF: wavelength $\lambda = 248$ nm), which performs pulse oscillation. The second laser is a long wavelength $CO_2$ laser (wavelength: $\lambda = 10.6$ microns). It is possible to use a YAG laser (wavelength: $\lambda = 1.06$ microns) in lieu of the $CO_2$ laser.

Reference numeral 6 designates a reference light source. Here, He-Ne laser is used. The optical axis of this laser is identical with the optical axis of laser 2.

Reference numeral 18 designates reference light beam sensor, which detects light proceeding along the optical axis of laser 4.

The optical axes of lasers 2 and 4 are parallel to each other. Laser 2 and reference light source 6 are secured to base 24. On the other hand, laser 4 and sensor 18 are integrally mounted on baser 24 for displacement in the directions of arrows perpendicular to the optical axis of laser 4. Base 28 is provided with drive means for causing the displacement noted above.

Reference numeral 12 designates mirror for deflecting a laser beam emitted from laser 2. Reference numeral 8 designates lens for converging the laser beam from laser 2. The lens is a quarts lens. Reference numeral 10 designates lens for converging the laser beam emitted from laser 4. This lens consists of ZnSe. It is possible to use GaAs in lieu of ZnSe.

Reference numeral 16 designates eventual printed circuit board as work. The board may be a glass epoxy copper lining lamination plate (available as "TLC-W-551" provided by Toshiba Chemical Co., Ltd., with a thickness of 0.6 mm). The board is supported for displacement on an X-Y displacement table (not shown).

The laser beam emitted from laser 2 is reflected by mirror 12 and then converged by converging lens 8 to form a beam spot (with a diameter of 100 microns) onto the upper side of printed circuit board 16 at a predetermined processing position.

The laser beam from laser 4 is reflected by mirror 14, and then converged by converging lens 10 to form a beam spot (with a diameter of 100 microns) onto the lower side of printed circuit board 16 at a predetermined position thereof.

The deflection angle of both the laser beams from mirrors 12 and 14 is 90 degrees, and reflected beams from these two mirrors proceed in the same directions but in opposite senses. Thus, the matching of the optical axes of two reflected beams can be effected such that the laser beam emitted from reference beam source 6 is detected by sensor 18 by causing displacement of laser 4 and sensor 18 in the directions of arrows with respect to base 28 without mounting printed circuit board 16.

Thus, in this embodiment very satisfactory perpendicular holes can be formed by disposing printed circuit board 16 perpendicular to the optical path of reflected beams from mirrors 12 and 14.

Reference numeral 30 designates a controller for controlling the oscillation of lasers 2 and 4.

Figure 12:
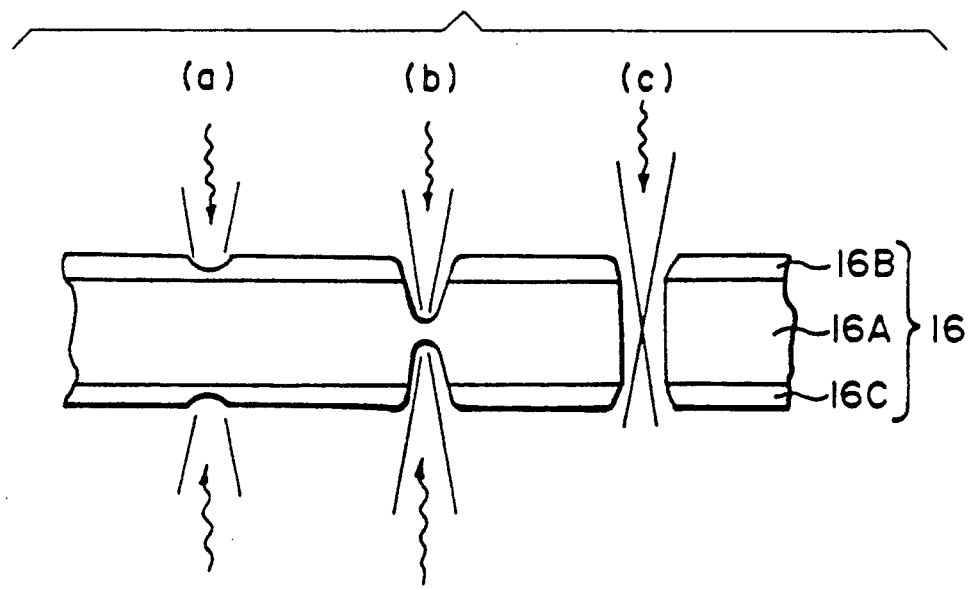

FIG. 12 is a sectional view showing printed circuit board 16 being processed for hole formation with the embodiment of the apparatus. As the processing proceeds, the status is changed from (a) to (c). Printed circuit board 16A consists of glass epoxy insulating layer (hereinafter referred to merely as "resin part" 16 and copper foil 16B and 16C provided on the opposite sides of layer 16A.

FIG. 13 is a view showing an example of pulse timings of lasers 2 and 4 in this embodiment.

Figure 13A:
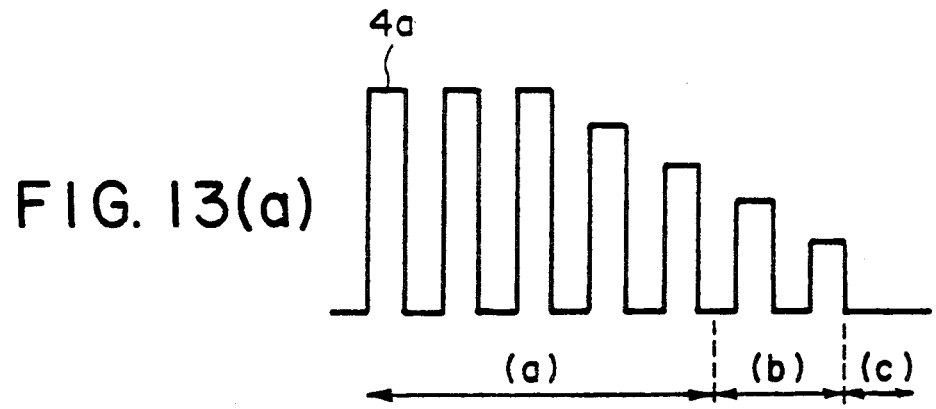

During processing of copper foil parts 16B and 16C as shown in FIG. 12(a), $CO_2$ laser beam 4a and excimer laser beam 2a are projected onto the upper and lower sides, as shown in FIG. 13(a). Since the excimer laser beam has a short wavelength, it provided high photon energy and is suited for the processing of copper foil part. Thus, the irradiation time is comparatively short.

Figure 13B:
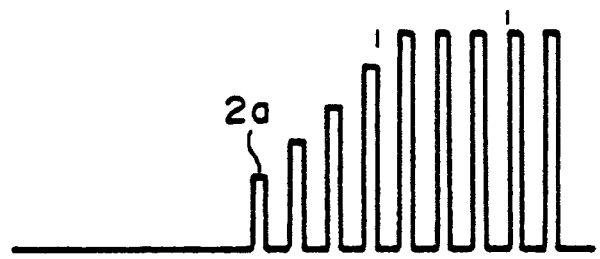

During processing of resin part 16A shown in FIG. 12(b), $CO_2$ laser beam 4a and excimer laser beam 2a are projected onto the upper and lower sides, as shown in FIG. 13(b). The $CO_2$ laser beam has a long wavelength, and thus it provides low photon energy and is mainly used for thermal processing. It is thus suited for the processing of resin part 16B.

In the processing using this long wavelength beam, however, carbide is generated. In addition, irregularities of the hole wall surface are liable to be increased due to difference etching rates of glass and epoxy. Accordingly, for the processing of the resin part excimer laser beam 2a is employed in combination as shown in FIGS. 12(c) and 13(c). Thus, the carbide can be removed, the difference of the etching rate can be reduced, and a hole with less irregularities of its surface can be obtained.

While in the above embodiment two lasers having different wavelengths are used, according to the invention it is possible to use lasers having the same wavelength as well.

As has been shown, in this embodiment two optical patsh leading from two lasers to a portion, and laser beams irradiating the printed circuit board are switched by reversible mirror. Thus, the two different laser beams can be projected perpendicularly onto the printed circuit board to obtain satisfactory hole formation.

In addition, both the high speed processing utilizing the high output of the long wavelength laser and the clear processing utilizing the high photon energy of the short wavelength laser can be performed, and desired lasers can be used for the processing of the resin part and processing of the copper foil part. It is thus possible to obtain satisfactory accuracy of processing and high processing speed.

Further, the matching of the optical axes of the two optical systems can be performed by detecting reference light beam from reference light beam source with sensor by using optical systems corresponding to the two lasers.

We claim:

1. A method of forming through holes in a substrate comprising the step of projecting two different laser beams of different wavelengths from a laser onto the substrate to form a plurality of through holes extending from the front side to the back side of the substrate for stepwise processing of the wall surface of the substrate in which said through holes are formed, said projecting step comprising the step of using two different laser beams having different wavelengths, one of said laser beams having a long wavelength in a visible to infrared range, the other one of said laser beams having a short wavelength in a visible to ultraviolet range.

2. The method of through hole formation according to claim 1, which comprises a first step of processing using a long wavelength beam and a second step of processing using a short wavelength beam.

3. An apparatus for forming through holes in a printed circuit board by using laser beam comprising:
- first laser means for providing a short wavelength laser beam;
- second laser means for providing a long wavelength laser beam;
- an optical system for projecting the laser beams from said first and second laser means onto a processing surface of the printed circuit board; and
- means for controlling the outputs of said first and second laser means such that said first and second laser means provide pulse laser beams,
- wherein said optical system includes a mirror for directing the laser beams from said first and second laser means to said printed circuit board, said mirror being reversely driven by said control means.

4. The apparatus for through hole formation, according to claim 3 wherein:
- said optical system includes converging lenses for said respective laser means, said converging lenses being switchedly driven by said control means.

5. The apparatus for through hole formation according to claim 5, wherein:
- said formation of through holes in said printed circuit board is formation of through holes in copper foil part on a substrate;
- said first laser means performs predetermined pulse oscillation for through hole formation in said copper foil part; and
- said second laser means performs predetermined pulse oscillation for through hole formation in a resin part as a substrate after through hole formation in the copper foil part by said first laser means.

6. The apparatus for through hole formation, according to claim 3 wherein:
- oscillation of said first laser means and oscillation of said second laser means are caused alternately during processing of the resin part of said printed circuit board.

7. An apparatus for forming through holes in a printed circuit board by using laser beam comprising:
- first laser means for providing a short wavelength laser beam;
- second laser means for providing a long wavelength laser beam;
- an optical system for projecting the laser beams from said first and second laser means onto a processing surface of the printed circuit board; and
- means for controlling the outputs of said first and second laser means such that said first and second laser means provide pulse laser beams,
- wherein said optical system includes first and second optical means having respective mirrors for switching the optical path of respective laser means and respective lenses for leading laser beams;
- said first optical means includes a first mirror held at a fixed position; and
- second optical means includes a second mirror capable of being displaced to be on the optical axis of said first optical means.

8. The apparatus for through hole formation according to claim 7, wherein:
- said displacement of said second mirror is synchronized to the oscillation of said second laser means.

9. The apparatus for through hole formation according to claim 7, wherein:
- said second mirror is held at a fixed position such as not to block the optical axis of said first optical means.

10. A method of forming through holes in a printed circuit substrate coated with first and second metal foil layers at the surfaces thereof by using a short wavelength laser beam and a long wavelength laser beam comprising steps of:
- forming a through hole through the first metal foil layers by a short wavelength pulse laser beam having a predetermined frequency;
- forming a through hole through a core material of the substrate by a long wavelength pulse beam having a predetermined frequency after forming the through hole in the first metal foil layer;
- projecting said short wavelength pulse beam onto the substrate into the through hole during said forming step of forming of the through hole in the core material by said long wavelength pulse laser beam; and
- forming a through hole through the second metal foil layer by the short wave length pulse laser beam after forming the through hole in the core material of the substrate.

* * * * *

UNITED STATES PATENT AND TRADEMARK OFFICE
CERTIFICATE OF CORRECTION

PATENT NO. : 5,126,532

DATED : June 30, 1992

INVENTOR(S) : HIDEHO INAGAWA ET AL.

It is certified that error appears in the above-identified patent and that said Letters Patent is hereby corrected as shown below:

COLUMN 1

Line 17, "such" should read --of such--.

Line 19, "sectionnal" should read --sectional--.

Line 50, "a" should read --discloses a--.

Line 53, "a" should read --an--.

Line 58, "indentical" should read --identical--.

Line 60, "$CO_2$" (second occurrence) should read --CO--.

Line 62, "rubby" should read --ruby--.

Line 63, "alexandlite" should read --alexandrite--.

COLUMN 2

Line 46, "optical" should read --optical system--.

COLUMN 4

Line 57, "wavelength:" should read --wavelength --.

UNITED STATES PATENT AND TRADEMARK OFFICE
CERTIFICATE OF CORRECTION

PATENT NO.   : 5,126,532
DATED        : June 30, 1992
INVENTOR(S)  : HIDEHO INAGAWA ET AL.

It is certified that error appears in the above-identified patent and that said Letters Patent is hereby corrected as shown below:

COLUMN 5

Line 45, "16A" should read --16--.

Line 46, "16" should read --16A--.

COLUMN 6

Line 40, "beam" should read --beams--.

COLUMN 7

Line 3, "numeral 28" should read --numeral 8--.

Line 4, "&he" should read --the--.

Line 25, "driver 14" should read --driver 24--.

Line 35, "driver 14" should read --driver 24--.

Line 60, "16A" should read --16--.

Line 61, "16" should read --16A--.

COLUMN 9

Line 23, "base 24." should read --base 28.--

Line 24, "baser 24" should read --base 28--.

UNITED STATES PATENT AND TRADEMARK OFFICE
CERTIFICATE OF CORRECTION

PATENT NO. : 5,126,532

DATED : June 30, 1992

INVENTOR(S) : HIDEHO INAGAWA ET AL.

It is certified that error appears in the above-identified patent and that said Letters Patent is hereby corrected as shown below:

COLUMN 9

Line 31, "quarts" should read --quartz--.

COLUMN 10

Line 2, "16A" should read --16--.

Line 3, "16" should read --16A--.

Line 12, "provided" should read --provides--.

Line 37, "patsh" should read --paths--.

COLUMN 11

Line 21, "formation," should read --formation--.

Line 22, "claim 3" should read --claim 3,--.

Line 27, "claim 5," should read --claim 3--.

Line 39, "formation," should read --formation--.

Line 40, "claim 3" should read --claim 3,--.

UNITED STATES PATENT AND TRADEMARK OFFICE
CERTIFICATE OF CORRECTION

PATENT NO.    : 5,126,532
DATED         : June 30, 1992
INVENTOR(S)   : HIDEHO INAGAWA ET AL.

It is certified that error appears in the above-identified patent and that said Letters Patent is hereby corrected as shown below:

COLUMN 12

Line 11, "path" should read --paths--.

Line 15, "second optical means" should read --said second optical means--.

Line 33, "layers" should read --layer--.

Line 45, "wave length" should read --wavelength--.

Signed and Sealed this

Ninth Day of November, 1993

Attest:

BRUCE LEHMAN

Attesting Officer     Commissioner of Patents and Trademarks